(12) United States Patent
Peddle

(10) Patent No.: US 8,122,319 B2
(45) Date of Patent: Feb. 21, 2012

(54) PAGE-BASED FAILURE MANAGEMENT FOR FLASH MEMORY

(75) Inventor: Charles I. Peddle, Santa Cruz, CA (US)

(73) Assignee: Charles I. Peddle, Santa Cruz, CA (US)

( * ) Notice: Subject to any disclaimer, the term of this patent is extended or adjusted under 35 U.S.C. 154(b) by 1043 days.

(21) Appl. No.: 11/657,935

(22) Filed: Jan. 24, 2007

(65) Prior Publication Data

US 2008/0177956 A1    Jul. 24, 2008

(51) Int. Cl.
*G11C 29/00*    (2006.01)
(52) U.S. Cl. ............... 714/763; 365/185.17; 365/185.22
(58) Field of Classification Search .................. 714/763; 365/185.22
See application file for complete search history.

(56) References Cited

U.S. PATENT DOCUMENTS

| | | | |
|---|---|---|---|
| 6,237,110 B1 | 5/2001 | Lin et al. | |
| 7,472,331 B2 * | 12/2008 | Kim | 714/763 |
| 2002/0048202 A1 * | 4/2002 | Higuchi | 365/200 |
| 2004/0196707 A1 * | 10/2004 | Yoon et al. | 365/200 |
| 2005/0270856 A1 | 12/2005 | Earhart et al. | |
| 2005/0276129 A1 * | 12/2005 | Meihong et al. | 365/200 |
| 2008/0002468 A1 * | 1/2008 | Hemink | 365/185.17 |

OTHER PUBLICATIONS

Micron Technology, Inc., NAND Flash Memory, 79 pages, 2006 Micron Technology, Inc., Boise Idaho USA.

\* cited by examiner

*Primary Examiner* — Sam Rizk
(74) *Attorney, Agent, or Firm* — Steven L. Nichols; Van Cott, Bagley, Cornwall & McCarthy P.C.

(57) ABSTRACT

A page-based failure management system for flash memory includes at least one flash memory device which includes at least one page and at least one operable page. The system also includes an indication of operability of the at least one page in the at least one flash device.

20 Claims, 6 Drawing Sheets

PAGE-BASED FAILURE MANAGEMENT FOR FLASH MEMORY

BACKGROUND

Flash memory is an increasingly common medium for non-volatile storage of information. Computers, cellular phones, portable music players, digital cameras, and many other devices use flash memory to store text, music, video, data, and other information. Flash memory provides relatively fast access, large capacity, shock resistance, and the ability to retain information without applied power.

Unfortunately, due to manufacturing defects, storage elements in a flash memory device may fail to correctly read, write, and/or store data. Manufacturers of flash memory often discard flash devices containing a significant number of operable storage elements due to a relatively few inoperable storage elements and consequently lose significant revenue. Using traditional failure management systems, each failed storage element may cause many operable storage elements to become inaccessible. Regrettably, flash memory devices are often discarded even though only a small fraction of each device may be inoperable.

Additionally, routine wear may cause flash memory to spontaneously fail. Each storage element of a flash memory device can only be programmed and erased a limited number of times. With extended use, flash memory storage elements may fail to receive, retain, and read data, which may limit the storage capacity of the device, destroy data, or render a flash memory device unusable. Flash memory storage elements may also fail spontaneously after minimal use in some situations. According to traditional failure management systems, multiple failures may significantly reduce the storage capacity of a flash memory device or result in the total failure of the flash memory device.

The failure of storage elements in flash memory devices, during the manufacturing process and during use, can severely diminish the reliability and value of flash memory devices.

SUMMARY

A page-based failure management system for flash memory includes at least one flash memory device which includes at least one page and at least one operable page. The system also includes an indication of operability of the at least one page in the at least one flash device.

BRIEF DESCRIPTION OF THE DRAWINGS

The accompanying drawings illustrate various embodiments of the principles being described in this specification and are a part of the specification. The illustrated embodiments are merely examples and do not limit the scope of the principles described herein.

Throughout the drawings, identical reference numbers designate similar, but not necessarily identical, elements.

DETAILED DESCRIPTION

Figure 1A:
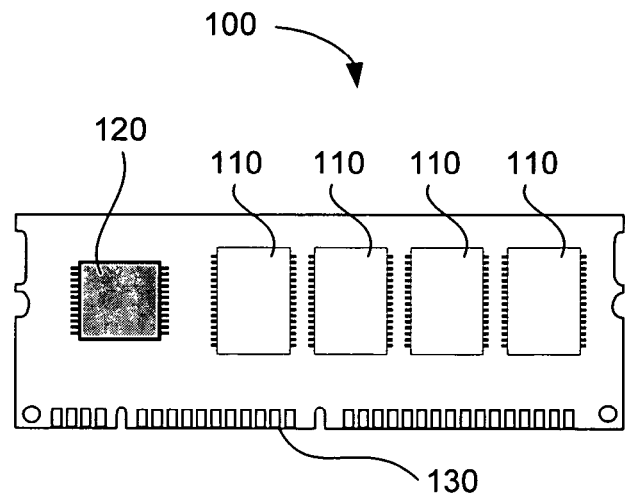
FIGS. 1A and 1B are schematic diagrams of a flash memory module, according to various exemplary embodiments.

Methods and systems for page-based failure management for flash memory are described herein. As will be described in detail below, the storage elements in a flash memory device may be organized into pages and blocks, with each block containing multiple pages. Additionally, each page may contain multiple data storage elements. According to the principles described herein, failures in a flash memory device may be identified according to the page in which a failure occurs, and not simply the block in which a failure occurs. Accordingly, a failure in one page may not affect other pages in the same block as the failed page. In traditional failure management systems specified by many flash memory manufacturers, a failure in one page may cause completely operable pages in the same block to become inaccessible, severely limiting the capacity of a flash memory device. The principles described herein enable functional pages to store and retrieve data, despite the failure of another page within the same block.

The principles described herein may increase the reliability of storage systems implemented with flash memory. Additionally, many flash memory devices that would normally be discarded may be reclaimed to function with significant storage capacity. Furthermore, the principles described herein may significantly increase the longevity of flash memory storage systems. A variety of further advantages and applications are possible without departing from the principles described herein.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

As used herein an in the appended claims, the term "indication" is defined broadly to include one or more references, pointers, addresses, tables, lists, sets, identifiers, labels, signs, tokens, codes, or equations, or other information which may indicate, or from which may be derived, at least one condition and/or characteristic of at least one item. Indicated conditions and characteristics may include, but are not limited to, identity, physical location, capability, operability, or other properties. An indication may directly or indirectly signify a condition and/or characteristic. For example, if two sets are mutually exclusive, a direct indication that an item is a member of the first set also indirectly indicates that the element is excluded from the second set. Additionally, an indication may specifically reference certain items, from which may be inferred information about other items not specifically referenced.

As used herein an in the appended claims, the term "operability" is defined broadly to include the state, condition, and/or degree of functionality of a component or device. Consideration of the operability of a component or device may include an assessment of the functionality and capabilities of the component or device and/or a comparison with desired or expected capabilities. When the operability of a component or device does not meet minimum requirements, the component or device may be considered inoperable, even though every function may not be inoperable. Conversely, a component or device meeting or exceeding minimum capabilities may be considered to be operable.

FIG. 1A illustrates a flash memory module, according to one exemplary embodiment. The flash memory module (100) includes one or more flash memory devices (110), a memory controller (120), and an electrical interface (130). A flash memory module (100) may be removable, as illustrated in FIG. 1, or the flash memory module (100) may be integrated into a larger circuit board or other electrical system. The memory controller (120) and electrical interface (130) are may be included in some of the embodiments of the principles described herein, but are not required in all embodiments.

An electrical interface (130) provides power to the components of the flash memory module (100), enables the memory controller (120) to receive commands, and transfers data to and from the flash memory devices (110). According to one embodiment, the electrical interface (130) may include one or more pins or contacts. In another embodiment, a memory controller (120), flash memory device (110), and an electrical interface (130) may be integrated into a single chip or package. In an integrated system or chip, the electrical interface may include electrical contacts, interconnects, wire traces, input/output (IO) logic, and other circuit elements. An electrical interface (130) may also connect a flash memory module (100) to additional transmission media, allowing data from the flash memory devices (110) to be transmitted through an infrared (IR) link, a radio frequency (RF) link, an optical interface such as fiber optics, a network, and other interfaces. In other embodiments, the electrical interface (130) may include a Universal Serial Bus (USB) connector, as in a flash, keychain or jump drive. The module illustrated in FIG. 1 may also be implemented as a removable media device such as a Secure Digital card (SD) or a Compact Flash card (CF).

A flash memory module (100) may also include one or more flash memory devices (110). As illustrated in FIG. 1A, flash memory devices (110) may include non-volatile semiconductor chips configured to store digital data. In particular, the flash memory devices (110) may include NAND (Not AND) flash semiconductor chips. In other embodiments, the flash memory devices may include NOR (Not OR) flash semiconductor chips. Flash memory devices (110) may include single level cell (SLC) and/or multiple level cell (MLC) devices. An applied voltage may be applied to read, write, and erase the flash memory devices (110), but the flash memory devices (110) may not require power to retain information once writing is complete.

Figure 1B:
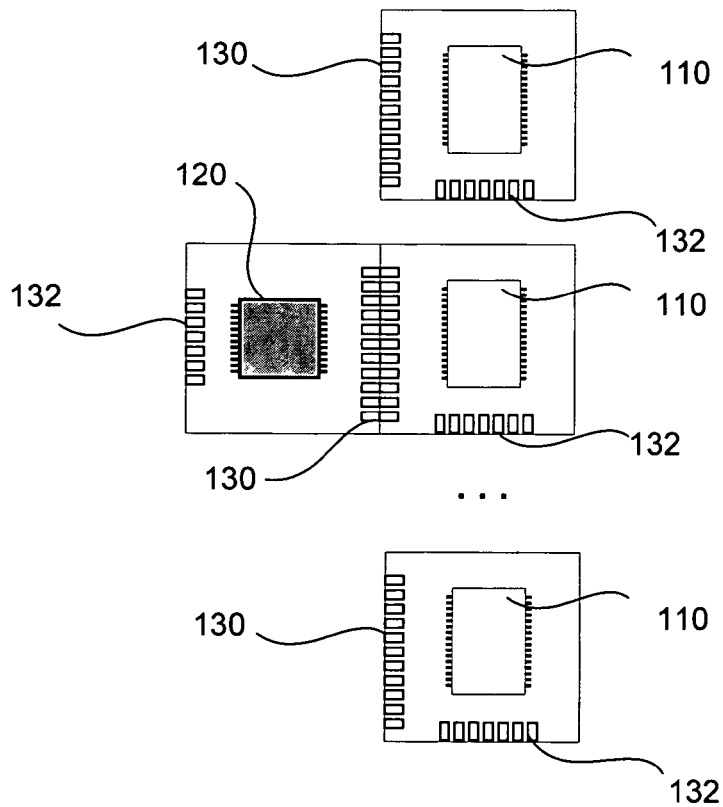

As illustrated in FIG. 1B, a memory controller (120) may be configured to operate on a multiple sets of flash memory devices (110). According to one embodiment, the memory controller (120) and flash memory devices (110) may be detachable and may communicate through an electrical interface (130). The memory controller (120) may operate on one or more flash memory devices (110) currently connected through the electrical interface (130), and then communicate with a second set of flash memory devices (110) when the first flash memory devices are removed and replaced. For example, a memory controller (120) may be configured to operate on detachable flash memory devices (110) such as those included in Secure Digital (SD) cards. At least one additional electrical interface (132) may allow the memory controller (120) or flash memory devices (110) to interface with additional system components.

Figure 2A:
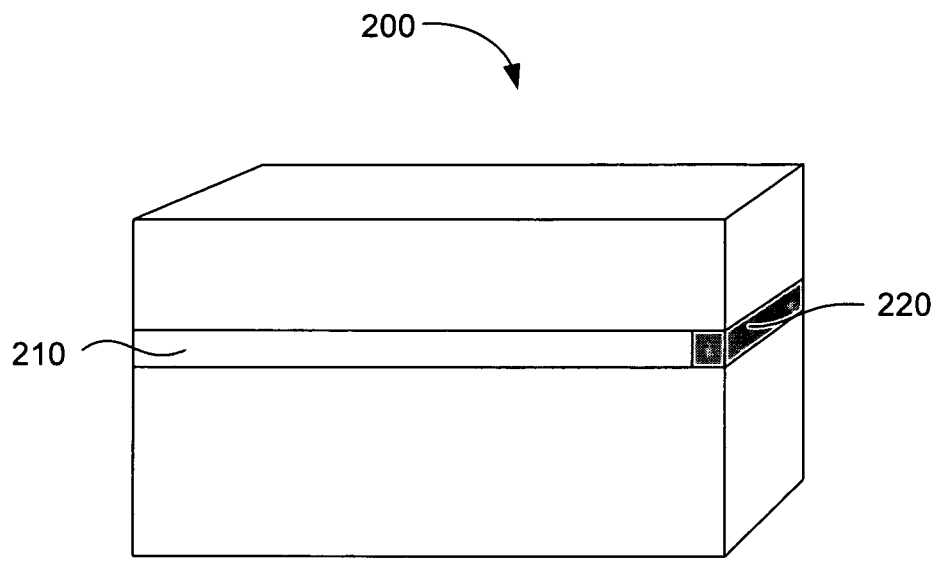
FIGS. 2A, 2B and 2C are schematic diagrams of flash memory organization, according to various exemplary embodiments.
Figure 2B:
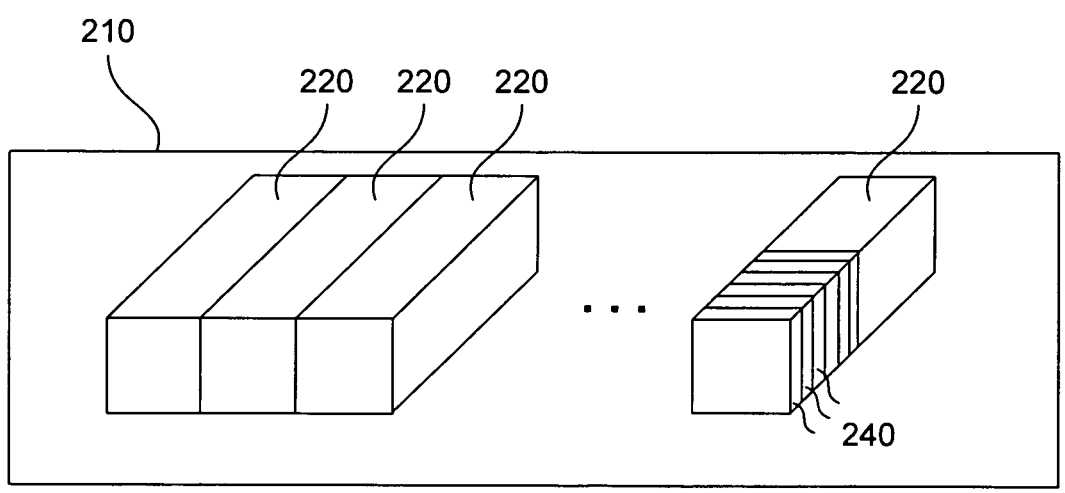

Flash memory devices (110) may be manufactured in a variety of data storage capacities, such as between 2 mega-bit (Mbit) to 16 giga-bit (Gbit), and other capacities. Flash memory modules (100) may include one or more flash memory devices (110) resulting in a variety of storage capacities of flash memory modules (100). According to one embodiment, flash memory devices (110) may be organized into blocks, pages, and individual bytes, as shown in FIGS. 2A and 2B, even though various flash memory devices (110) vary in total storage capacity. Additionally, some flash memory devices (110) may be organized into blocks, pages, and words where a word includes more than one byte or less than one byte.

Figure 2C:
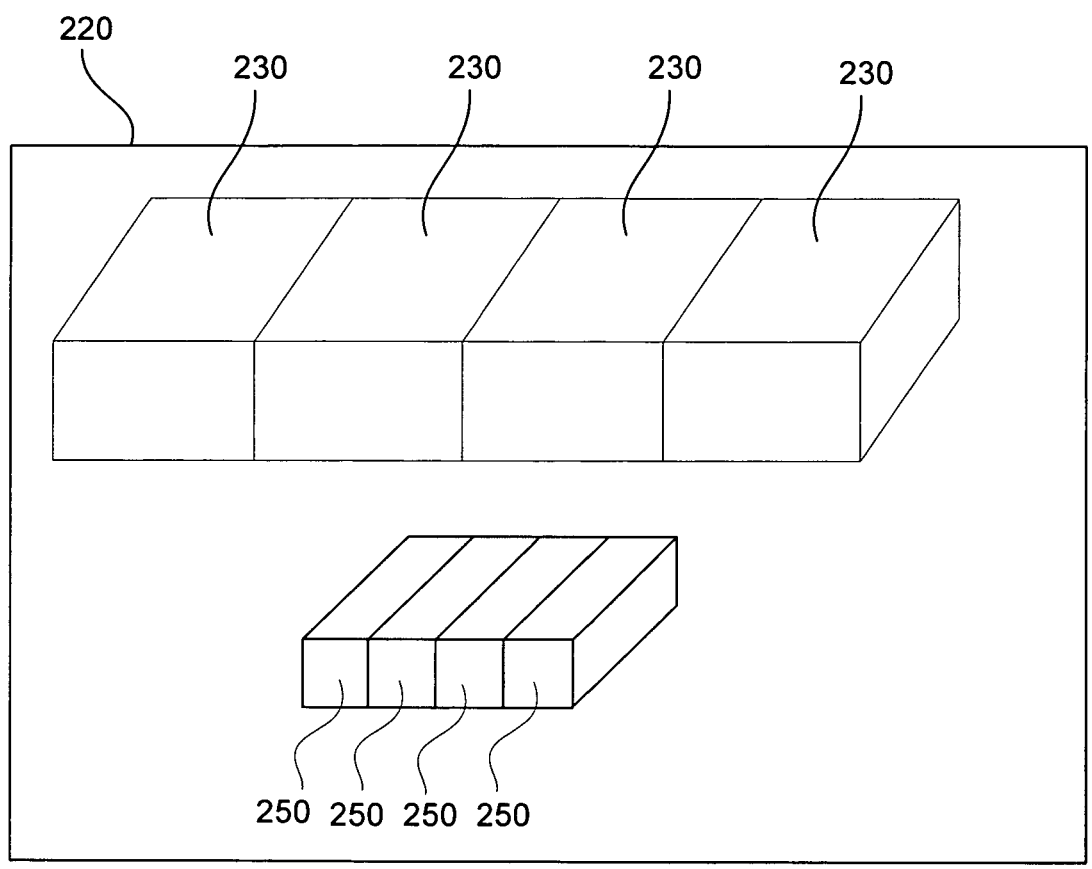

The organization of an exemplary flash memory device (110) is illustrated in FIGS. 2A, 2B, and 2C. A flash memory device (110) with a rated capacity of 2 Gbit may include 2048 blocks (210), for example. According to one embodiment, each block (210) may contain 64 pages (220) with each page (220) containing 2048 data bytes (240), according to industry standards. A 4 Gbit flash memory device (110) may contain twice the number of blocks (210) and the same number of pages (220) per block (210) and bytes (240) per page (220). Thus, according to one exemplary embodiment, a page (220) may contain 2 kilobytes (KB) and a block may contain 128 KB. According to another embodiment, a block may contain larger pages or a greater number of pages for a capacity of 256 KB or more.

As illustrated in FIG. 2C, a page (220) may be logically partitioned into sectors (230), each of which contains a number of bytes (240). A number of data or non-data bytes (240) may be associated with one or more pages (220) or sectors (230) to facilitate error checking and correction (ECC). One or more bytes (240) used for ECC may form an ECC storage unit (250) that may be associated with one or more sectors (230). According to one embodiment, a page (220) with 2048 data bytes may be partitioned into four sectors (230) of 512 bytes each. Each sector (230) may have one or more associated ECC storage units (250). Exemplary ECC units (250) may include 10 bytes, 16 bytes, or any other fixed number of bytes. Alternatively, the ECC storage units (250) contain a variable number of bytes as indicated by a memory controller (120), a manufacturer of flash devices, device specifications, application requirements, or any communicatively coupled device. Another exemplary flash memory device (110) may not include any extra ECC bytes (240) or ECC storage units (250). ECC storage units (250) of varying capacities may be associated at any level of the flash memory device (110) organization, including for entire devices (110), blocks (210), pages (220), and sectors (230). ECC storage is not limited to a single level of the flash hierarchy. For example, an ECC storage unit (250) may assigned to a page (220) containing sectors (230) that each have different ECC storage units (250) assigned to them.

Unfortunately, an entire block (210) is traditionally considered unusable when a single bit in one of the pages (220) is inoperable. Consequently, a defective bit may reduce the storage capacity of a flash memory device (110) by 128 KB or more. When multiple defective bits are dispersed among many blocks, a flash memory device (110) may fail to meet capacity standards and the flash memory device (110) may be discarded. However, many completely functional pages (220) remain within each failed block (210). As will be described in detail below, by identifying inoperable pages (220) rather than inoperable blocks (210), much of the storage capacity of a flash memory device (110) may be reclaimed.

Various commands are used to access a flash memory device (110). According to one exemplary embodiment, read and write commands to a flash memory device (110) may operate on a single page (220). Erase commands, however, may affect an entire block (210). With the exception of block erase operations, nearly all operations may be performed on a single page (220). Once the pages (220) in a block (210) are erased, they may be selectively written in a manner that avoids inoperable pages (220). Although a flash memory device (110) may not include logic to select only operable pages (220) within a block (210), a memory controller (120) may be configured to identify, select, and operate on only the operable pages (220).

A flash memory device (110) may include additional components not illustrated including, but not limited to, data registers, command registers, cache registers, status registers, storage for error checking and correction (ECC) data, ECC checksum generation logic, and other components.

Returning to FIG. 1, a memory controller (120) coordinates the transfer of data to and from the flash memory devices (110). The memory controller (120) processes requests from external devices by sending appropriate commands and memory addresses to one or more flash devices (110). According to one embodiment, the memory controller may generate chip select, block select, row select, and column select signals to transmit to one or more flash memory devices (110). The memory controller (120) may also monitor control signals, status signals, timing constraints, and other aspects of data transfers to and from a flash memory device (110).

According to the embodiment illustrated in FIG. 1, the memory controller (120) may be implemented as a semiconductor chip separate and distinct from the flash memory devices (110). According to another embodiment, logic implementing at least one memory controller (120) may be integrated into the same semiconductor die or package as a flash memory device (110). For example, a flash device (110) and a memory controller (120) may be integrated together in variety of applications including, but not limited to, system on a chip (SoC), system in package (SiP), flash-based field programmable gate array (FPGA), and other applications. According to yet another embodiment, a memory controller (120) may be implemented as a separate module and communicate with a flash memory module (100) through an electrical interface (130).

The memory controller (120) may provide a computer, camera, or other device access to one or more flash memory devices (110). For example, the memory controller (120) may translate a virtual memory address from an external system to a physical address on one or more flash memory devices (110). A memory controller (120) may receive a query from a processor requesting certain data words. In response, the memory controller (120) may determine the corresponding block (210), page (220), and byte (240) where the requested data is physically stored in one or more flash memory devices (220). The memory controller (120) may then issue the correct sequence of control signals and memory address values to the flash memory device (110) to retrieve the requested data.

Similarly, the memory controller (120) may translate write requests into an appropriate sequence of block erase, address select, and write commands to store data on a flash memory device (110). In effect, the memory controller (120) may allow various systems and components access to the storage of the flash memory devices (120) while concealing the complexity of the interface with the flash memory devices (110). For example, when previously written data in a flash memory device (110) is updated, the old data as well as the new data must be written to a new block (210) and the old block (210) must be erased. The memory controller (120) may generate and execute the correct sequence of operations to carry out the storage operation. The memory controller (120) may also identify which blocks (210) that contain a sufficient number of operable pages (220) to complete an operation. Where data is transferred from a source block (210) to a destination block (220), the destination block contain at least the same amount of storage capacity as the source block, but the destination block may still include one or more inoperable pages (220) or sectors (230).

Figure 3A:
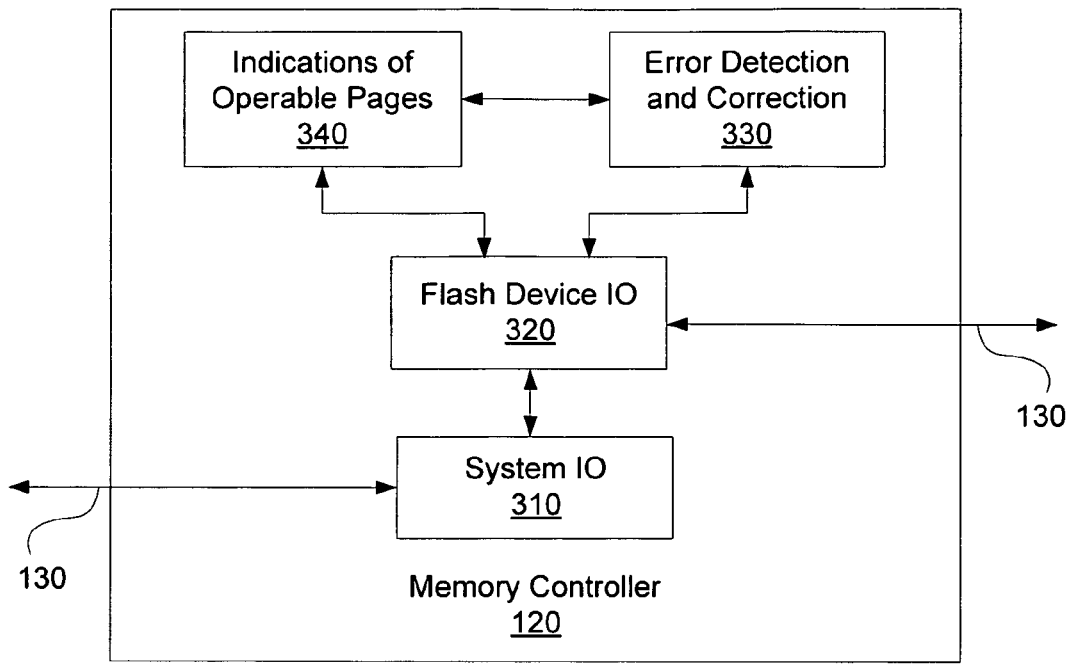
FIGS. 3A and 3B are block diagrams illustrating elements of a memory controller, according to various exemplary embodiments.
Figure 3B:
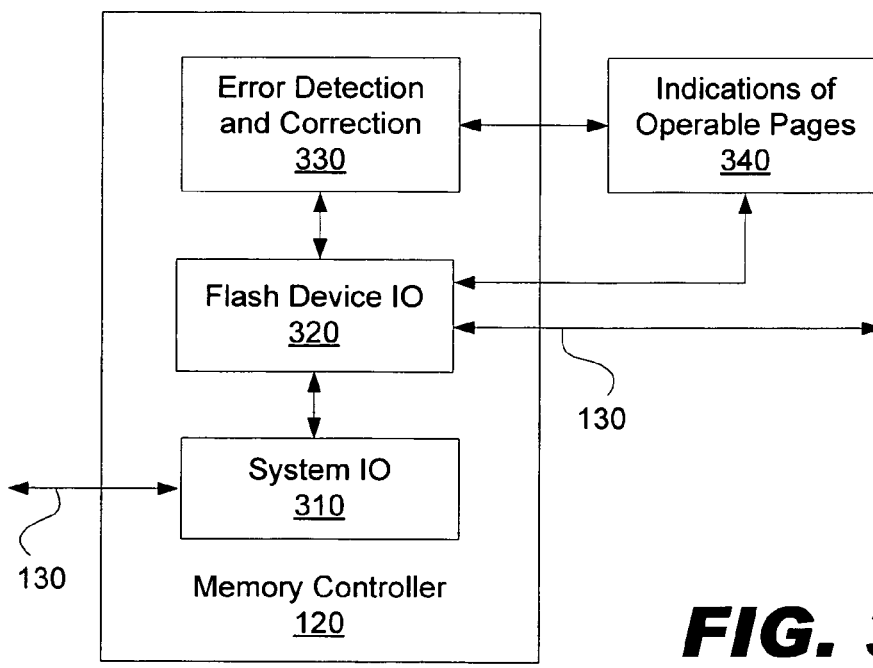

Some elements of an exemplary memory controller (120) are illustrated in the block diagrams of FIGS. 3A and 3B.

As illustrated, the memory controller may communicate with the flash memory devices (110) and external systems through one or more electrical interfaces (130). To communicate effectively with a flash memory device (110), the memory controller (120) may be configured to multiplex address values, data, commands, and/or other signals on wires between the memory controller (120) and flash memory devices (110). In addition, the memory controller (120) may be configured to communicate with attached systems through a variety of electrical interfaces (130), including, but not limited to, Universal Serial Bus (USB), FireWire (IEEE 1394), the front side bus (FSB) of a processor, Secure Digital card (SD), Compact Flash card (CF), and other proprietary interfaces. A system input/output (IO) logic component (310) may implement the various protocols above and interpret signals received from attached systems and devices.

The memory controller (120) may also include a flash device IO module (320) configured to generate appropriate control signals, chip select signals, block addresses, page addresses, column addresses, row addresses, and other signals to interface with one or more flash memory devices (110). For example, a flash IO module (320) may execute a read or write operation by asserting appropriate control signals and then transmitting a sequence of column address and row address values to specify a location to read or write data. Additionally, the flash IO module (320) may implement features such as write protection of critical data or wear leveling.

According to the embodiment of FIG. 3A, at least one indication (340) of at least one operable page (220) is stored by the memory controller (120). Alternately, as illustrated in FIG. 3B, at least one indication (340) of at least one operable page (220) may be stored separate from the memory controller (120), such as in a flash memory device (110).

Returning to FIG. 3A, according to one embodiment, an indication of operable pages (340) may include a table of the operable pages (220) within each block (210). Consequently, a flash IO module (320) may refer to at least one indication of operable pages (340) to select operable pages (220) to operate on and thus avoid inoperable pages (220) within a block (210). According to another embodiment, an indication of operable pages (340) may identify inoperable pages (220) and thus identify operable pages (220) indirectly. The flash IO module (320) may then be configured to read and write to any page (220) except those listed as inoperable. An indication (340) may indicate the operability of one or more pages directly or indirectly. An indication (340) of operable pages (220) may include one or more references, pointers, addresses, tables, lists, sets, identifiers, labels, signs, tokens, codes, or equations, or other information that may allow an operable page (220) to be identified. Additionally or alternately, an indication (340) of operable pages (220) may include an indication of one or more operable sectors (230) within a page (220), thus allowing operable sectors (230) to be identified and used for data storage even if one or more sectors (230) within the same page (220) is inoperable.

According to another embodiment, an indication (340) of operable pages (220) may include interconnects, fuses, programmable switches, look-up tables, firmware, ECC storage units (250), temporary or persistent memory, or other circuit elements configured to identify storage locations in a flash memory device (110). According to one embodiment, an indication (340) of operable pages (220) may generate addresses corresponding to storage locations in a flash memory device (110). Programmable or configurable circuit elements programmed to identify and access operable pages (220) within a block (210) may allow flash memory operations to be performed with a minimal page selection delay. Also, programmable circuit elements may conveniently allow access to be denied to inoperable pages (220).

At least one indication (340) of at least one operable page (220) may be stored in the memory controller (120) or in a flash memory device (110) associated with the memory controller (120). In one embodiment, a table of operable pages (220) within a flash memory device (110) may be stored in the first block (210) of the flash memory device (110).

According to one embodiment, at least one indication (340) may be created and stored in a testing process that does not require a memory controller (120). Initial one-time testing of one or more flash memory devices (110) with specialized testing equipment may take place to test the pages of the flash memory device (110), identify operable pages (220) or inoperable pages (220), and/or store the indication (340) of operable pages (220) specific to each flash memory device (110). A memory controller (120) may subsequently be communicatively attached to the one or more flash memory devices (110), and the memory controller (120) may read and access the indication (340) to identify operable pages (220) on which to operate. In this and other embodiments, the memory controller (120) is not required to thoroughly test the pages (220) of the one or more flash memory devices (110) because the indication (340) of operable pages (220) was previously determined and previously stored.

The memory controller (120) may also include an error checking and correcting (ECC) module (330). According to one embodiment, the ECC module (330) may test one or more flash memory devices (110) and create an indication (340). For example, thorough testing of an entire flash memory device (110) by a memory controller (120) may occur when an indication (340) is incomplete, unreadable, missing, or damaged. This type of testing may occur when the memory controller (120) and/or flash memory devices (110) are powered on for the first time. According to one embodiment, at least one page (220) of at least one flash memory device (110) may be erased and written with a known data pattern. A page (220) being tested may then be read to verify that the write command successfully stored the original known data pattern. Individual operations on a flash memory device (110), block (210), page (220), sector (230), or byte (240) may also be tested. Additionally, in some embodiments, the ECC module (330) may monitor status signals during testing to verify that a flash memory device (110) is functioning properly.

Subsequent to initial testing, whether performed by a dedicated test station or a memory controller, an ECC module (330) may also perform tests during operation of a flash memory device (110) to detect pages (220) that fail during use. Error detection methods used during flash memory operation may include, but are not limited to, generating checksums, comparing checksums, performing redundancy checks, generating parity values, performing parity checks, and executing other error detection algorithms. If a failure is detected in a page (220), the ECC module (330) may alert the flash IO module (320) that a failure occurred or that an operation in progress was unsuccessful. The flash IO module (320) may then repeat the operation in a new page (220) or otherwise correct the error. Additionally, the ECC module (330) may update the indication (340) of operable pages (220) to exclude any pages (220) that are determined to be inoperable.

According to the exemplary block diagram of FIG. 3B, one or more indications (340) of operable pages (220) may be stored separate from the memory controller (120). For example, the indications (340) of operable pages (220) may be stored in the ECC storage units (250) in a flash memory device (110). One or more indications (340) of operable pages (220) may also be stored in a chip, memory device or other circuit element communicatively coupled to one or more memory controllers (120) or to one or more flash devices (110). A memory controller (120) may also be configured to locate and use indications (340) of operable pages (220) not stored within the memory controller (120) to allow the memory controller (120) to operate on various flash memory devices (110) at various times.

For example, a removable flash memory card may or may not contain a dedicated memory controller (120). If the card does not contain a dedicated memory controller (120), indications (340) of operable pages (220) in one or more flash memory devices (110) may be stored directly in one or more flash memory devices (110) and/or other circuit elements in the memory card. When the memory card is attached to a memory controller (120), the memory controller (120) may operate on the flash memory devices (110) in the card using the pre-determined indications (340) of operable pages (220) in the memory card. The memory card may be detached and used with any appropriate memory controller (120). The indications (340) of operable pages (220) may also be updated by any connected memory controller (120) as necessary.

According to another embodiment, one or more indications (340) of operable pages (220) may be stored both in a memory controller (120) and in another location such as an ECC storage unit (250) for redundancy and to allow interoperability.

Figure 4:
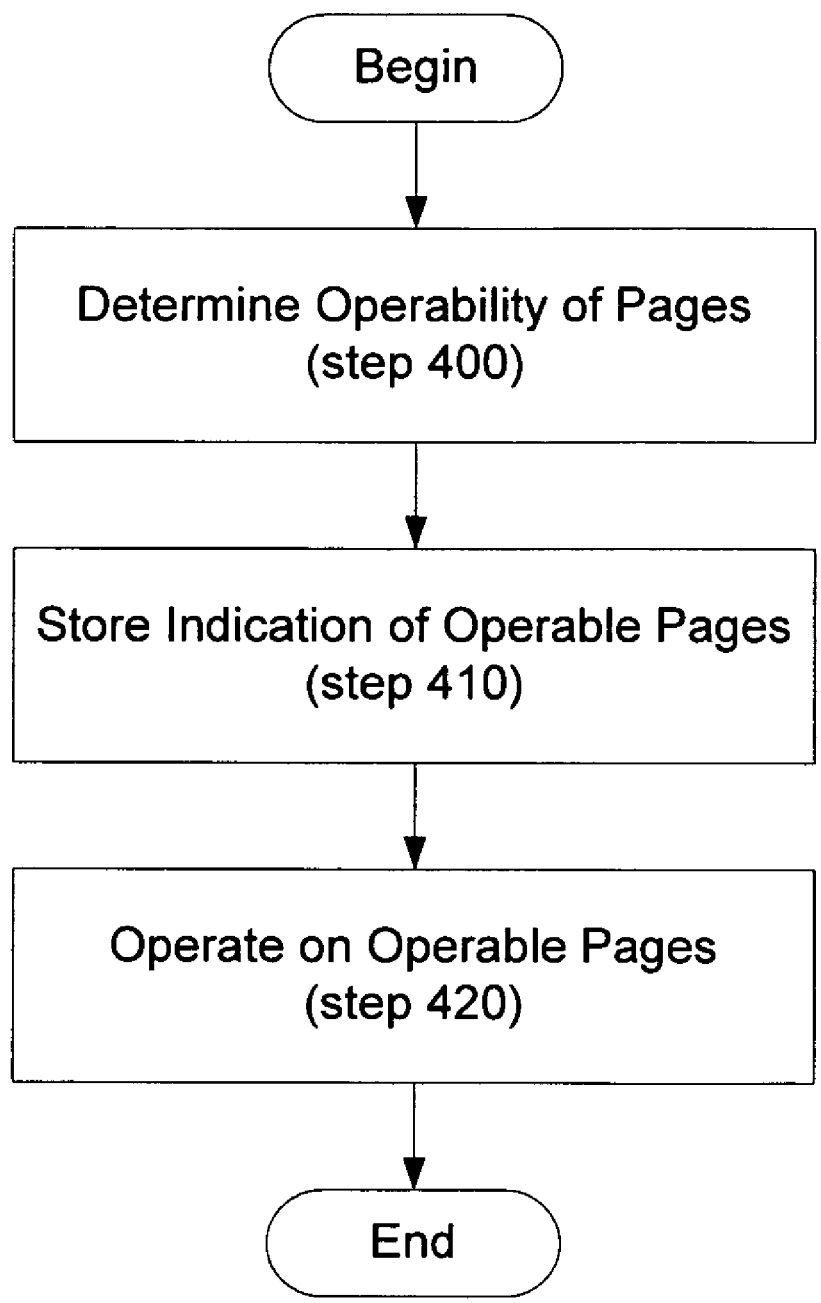
FIG. 4 is a flowchart illustrating a method of managing flash memory failures, according to one exemplary embodiment.
Figure 5:
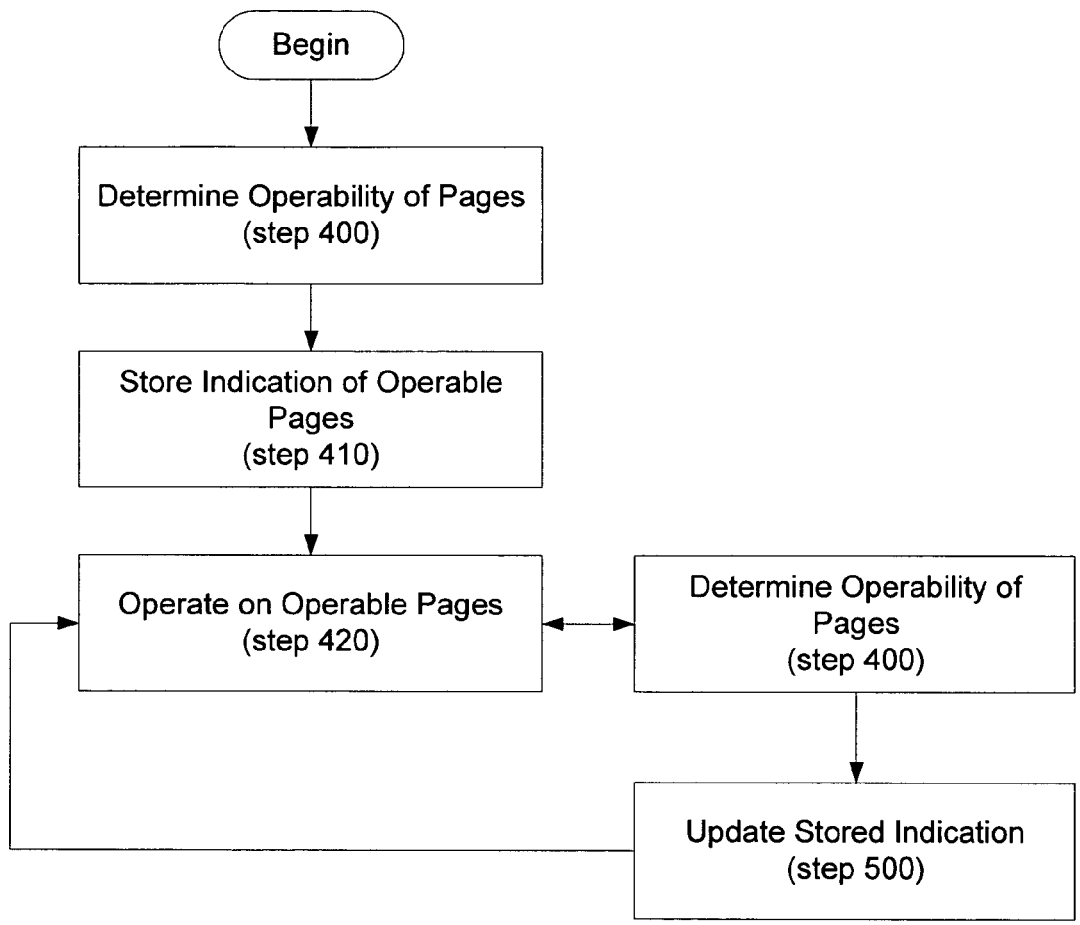
FIG. 5 is a flowchart illustrating another method of managing flash memory failures, according to one exemplary embodiment.

Exemplary methods for page-based failure management for flash memory are illustrated in FIG. 4 and FIG. 5.

As illustrated in FIG. 4, the operability of one or more pages (220) is determined in step 400. According to one embodiment, operability may be determined through testing one or more pages (220). For example, a page (220) may be erased, programmed with data, and then read to retrieve the data programmed. If the data read matches the data that the write command attempted to write, then the tested page (220) may be considered to be operable. Conversely, if data read does not exactly match data written, the page (220) may be considered inoperable. Additionally or alternately, a page (220) may be erased and then tested to verify that any data previously in the page (220) was successfully erased.

According to one embodiment, one or more pages (220) of a flash memory device (110) may be tested for operability at the first initialization or application of power to the flash memory device (110) and/or memory controller (120).

According to another embodiment, various error checking methods may be employed during operation of a flash memory device (110) to determine the operability of one or more pages (220) in step 400. For example, one embodiment may calculate a parity value, checksum, or other data to verify correct operation of one or more pages (220). A cyclic redundancy check, for example, may include the transmission of a checksum along with data to be stored in a flash memory device (110). After data is written to the flash memory device (110), a checksum may be generated and then compared with the received checksum. If the checksum values are not identical, an error has occurred. Redundancy checks and other error detection and correction methods allow errors and page failures to be detected during operation on a flash memory device. Error checking may prevent the loss of data by determining when an operable page (220) fails and becomes inoperable.

Once the operability of one or more pages (220) has been determined, at least one indication (340) of the previously determined operability is stored in step 410. Specifically, information is stored to directly or indirectly indicate that at least one page (220) is operable. According to one embodiment, the indication (340) of at least one operable page (220) may include a list, table, set, or other record identifying operable pages (220) within the blocks (210) of a flash memory device (110). Operable pages (220) may be identified by a memory address, page index, label, identifier, and/or other references.

Alternately or additionally, one or more pages (220) may be indirectly indicated to be operable by being excluded from an indication (340) of inoperable pages (220). In one embodiment, a list, table, or other indication may identify one or more inoperable pages (220). Before a particular page (220) is written, the indication of inoperable pages (220) may be searched to ensure that the page (220) to be written is not inoperable. It may be advantageous to identify failures instead of operable pages (220) to reduce the number of references or indications (340) stored in the case that the majority of pages (220) are operable.

Although steps 400 and 410 may be performed by a memory controller (120) in some embodiments, steps 400 and 410 are not required to be performed by a memory controller (120) and may be performed during a testing phase before a memory controller (120) is ever attached to the flash memory devices (110).

After at least one indication (340) is stored identifying at least one operable page (220), operable pages (220) are operated on in step 420. Operations on pages (220) and blocks (210) may include read, write, erase, data move, and other operations supported by the flash memory devices (110). Even though a block (210) may include inoperable pages (220), operable pages (220) within the same block (210) may still be identified and operated on. Since operable pages (220) may be designated by the indication (340) stored during step 410, inoperable pages (220) may be avoided.

FIG. 5 illustrates another method of failure management for flash memory. In the method of FIG. 5, like the method of FIG. 4, the operability of at least one page (220) is determined in step 400, at least one indication (340) of the operability of at least one page (220) is determined in step 410, and operable pages (220) are operated on in step 420.

Before and/or during operation on one or more pages (220) in step 420, step 400 may be repeated in whole or in part to concurrently determine the operability of one or more pages (220). For example, during a write operation, a previously operable page (220) may be determined to be inoperable. Since the failure may be detected during or soon after the write operation, the operation may be repeated in another page (220) to avoid data loss.

The repetition of step 400 does not require thorough testing of an entire flash memory device (110) and does not require that the same pages (220) be tested each time step 400 is performed. According to one embodiment, the first time step 400 is performed, the operability of all the pages (220) of one or more flash memory devices (110) may be determined by equipment dedicated to testing. When step 400 is later repeated, however, a memory controller (120) may test only a subset of the pages of one or more flash memory devices (110). Pages (220) that were determined to be inoperable in initial testing need not be tested again by a memory controller (120), and a memory controller (120) may test only pages that will be immediately read or written.

Step 400 may also include the determination of one or more probabilities of failures of pages (220) in a flash memory device (110) or sectors (230) within those pages (220). One or more pages (220) or sectors (230) may be considered inoperable when the pages (220) or sectors (230) are suspected of being inoperable, even though actual failure has not occurred. According to one embodiment, a probability of failure of one or more components of one or more flash memory devices (110) may be calculated to predict failures. When the probability of failure reaches a threshold, one or more pages (220) or sectors (230) at risk of failure may be considered inoperable to avoid the possibility of data loss.

When a page (220) is found to be inoperable, one or more stored indications (340) may be updated to indicate the change in operability in step 500. A stored indication (340) including a table of operable pages, for example, may be updated by removing a reference to an inoperable page (220) from the table of operable pages (220). A stored indication (340) including a list of inoperable pages (220) may be updated by adding a reference to an inoperable page (220) to the list. Updating one or more stored indications (340) may additionally involve moving data from one page (220) to another, updating memory addresses to correspond with correct data, adjusting the storage capacity of one or more flash memory devices (110), and other operations.

When one or more indications (340) are updated, internal operations and data transfers may be completed to hide failures and reconfigurations from systems accessing the flash memory devices (110) and ultimately from a human user of the flash memory devices (110). Consequently, a failure will not disturb the overall experience of a user and will not require extensive compensation by outside systems. According to one embodiment, this may be accomplished with spare blocks (210), pages (220), and/or sectors (230) that may be reserved during an initialization, testing, or other phase. As failures occur, data and addresses for failing blocks (210), pages (220), and/or sectors (230) may be replaced by spare blocks (210), pages (220), and/or sectors (230). One or more indications (340) may then be updated to reflect the new logical memory addresses and physical memory addresses for the data.

According to another embodiment, a signal or other reflection of a failure may be transmitted to indicate that a failure is occurred. A signal indicating a failure may aid debugging, indicate that capacity has decreased, or for other purposes.

The preceding description has been presented only to illustrate and describe examples of the principles discovered by the applicants. This description is not intended to be exhaustive or to limit these principles to any precise form or example disclosed. Many modifications and variations are possible in light of the above teaching.

What is claimed is:

1. A page-based failure management system for flash memory, comprising:
at least one flash memory device, said at least one flash memory device comprising a plurality of blocks, each of said blocks comprising a plurality of pages; and
a memory controller for executing read, write and erase commands for said at least one flash memory device;
wherein said memory controller has at least one indication of an inoperable page in said flash memory device, said memory controller using other operable pages in a same block that contains an inoperable page.

2. The system of claim 1, wherein said at least one indication is stored in said at least one flash memory device.

3. The system of claim 1, wherein at least one operable page is identified from said indication identifying said at least one inoperable page.

4. The system of claim 3, wherein said at least one indication is determined prior to operation on said at least one operable page.

5. The system of claim 1, wherein at least one page further comprises a plurality of sectors and said at least one indication further identifies the operability of at least one operable sector individually in said at least one page.

6. The system of claim 1, wherein said memory controller is further configured to determine the operability of individual pages during operation of said flash memory device and update said at least one indication of an inoperable page.

7. The system of claim 1, wherein said memory controller is further configured to determine at least one change in operability of said at least one page.

8. The system of claim 7, wherein said memory controller is further configured to update said at least one indication to indicate said at least one change in operability of said at least one page.

9. The system of claim 7, wherein said change in operability is determined concurrently with operation on at least one operable page.

10. The system of claim 1, wherein said at least one flash memory device comprises at least one NAND flash memory device.

11. The system of claim 1, wherein said memory controller and said at least one flash memory device are configured to separate and reattach.

12. The system of claim 1, wherein said at least one indication comprises a table of operable pages within each block.

13. The system of claim 1, wherein said at least one indication comprises a table of inoperable pages within each block.

14. The system of claim 1, further comprising an error and checking correction (ECC) module for detecting pages that fail during operation of said flash memory device and for updating said at least one indication of an inoperable page in said flash memory device.

15. A method of page-based failure management for flash memory, comprising:
   in a flash memory device comprising a plurality of blocks, each of said blocks comprising a plurality of pages,
   storing at least one indication of the operability of at least one said page in said flash memory device; and
   operating on at least one page, indicated to be operable by said at least one indication, that is located in a same block as another page indicated to be inoperable by said at least one indication.

16. The method of claim 15, further comprising determining the operability of at least one of said pages, wherein said determining step and said operating step are performed concurrently.

17. The method of claim 15, further comprising updating said at least one indication to reflect a change in operability of said at least one page.

18. The method of claim 15, wherein said indication identifies an operable page.

19. The method of claim 15, wherein said indication identifies at least one inoperable page.

20. The method of claim 15, wherein each page comprises a plurality of sectors, said method comprising tracking operability of individual sectors and using operable sectors even if one or more sectors within a same page are inoperable.

* * * * *